(12) United States Patent
Qawami

(10) Patent No.: US 11,200,113 B2
(45) Date of Patent: Dec. 14, 2021

(54) AUTO-INCREMENT WRITE COUNT FOR NONVOLATILE MEMORY

(71) Applicant: Intel Corporation, Santa Clara, CA (US)

(72) Inventor: Shekoufeh Qawami, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/742,332

(22) Filed: Jan. 14, 2020

(65) Prior Publication Data

US 2020/0151052 A1     May 14, 2020

(51) Int. Cl.
*G06F 11/10*     (2006.01)
*G06F 11/07*     (2006.01)
*G06F 3/06*      (2006.01)
*G06F 9/54*      (2006.01)
*G06F 9/30*      (2018.01)

(52) U.S. Cl.
CPC .......... *G06F 11/1044* (2013.01); *G06F 3/064* (2013.01); *G06F 3/0619* (2013.01); *G06F 3/0659* (2013.01); *G06F 3/0688* (2013.01); *G06F 9/30098* (2013.01); *G06F 9/542* (2013.01); *G06F 9/546* (2013.01); *G06F 11/076* (2013.01); *G06F 11/0772* (2013.01); *G06F 11/1076* (2013.01)

(58) Field of Classification Search
CPC .. G06F 11/076; G06F 11/1076; G06F 3/0656; G06F 11/3034; G06F 3/061; G06F 9/30098; G06F 9/546; G06F 3/064; G06F 9/542; G06F 3/0688; G06F 11/1048; G06F 11/0772; G06F 11/3037; G06F 11/34; G06F 11/004; G06F 3/0619; G06F 3/0659; G06F 2201/88; G06F 11/1044
See application file for complete search history.

(56) References Cited

U.S. PATENT DOCUMENTS

| | | | |
|---|---|---|---|
| 9,524,790 B1 * | 12/2016 | Steiner | G11C 16/28 |
| 10,019,198 B2 | 7/2018 | Hady | |
| 10,031,845 B2 | 7/2018 | Hady | |
| 10,067,866 B2 | 9/2018 | Sutardja | |
| 2009/0138654 A1 | 5/2009 | Sutardja | |
| 2009/0285008 A1 * | 11/2009 | Jeong | G11C 8/10 |
| | | | 365/148 |

(Continued)

OTHER PUBLICATIONS

Extended European Search Report for Patent Application No. 20197332.8, dated Mar. 15, 2021, 8 pages.

(Continued)

*Primary Examiner* — Guy J Lamarre
(74) *Attorney, Agent, or Firm* — Compass IP Law PC

(57) ABSTRACT

A memory device has multiple nonvolatile (NV) memory arrays that collectively store a block of data, with each array to store a portion of the data block. A selected NV memory array stores a write count for the block of data. In response to a write command, the NV memory arrays that store data perform an internal pre-write read. The selected NV memory array that stores the write count will perform a pre-write read of the write count, increment the write count internally to the selected NV memory array, and write the incremented write count back to the selected NV memory array.

20 Claims, 7 Drawing Sheets

(56) References Cited

U.S. PATENT DOCUMENTS

| | | | |
|---|---|---|---|
| 2012/0008374 A1 | 1/2012 | Huang et al. | |
| 2014/0016397 A1 | 1/2014 | Lee et al. | |
| 2014/0226413 A1* | 8/2014 | Gomez | G11C 16/3454 365/185.22 |
| 2015/0242143 A1* | 8/2015 | Kim | G11C 16/349 714/704 |
| 2016/0019974 A1* | 1/2016 | Blodgett | G06F 11/076 365/185.03 |
| 2017/0140807 A1* | 5/2017 | Sun | G11C 29/023 |
| 2019/0066808 A1* | 2/2019 | Nale | G11C 7/02 |
| 2019/0391916 A1* | 12/2019 | Hsieh | G06F 11/076 |
| 2020/0098421 A1* | 3/2020 | Alsasua | G11C 11/40615 |

OTHER PUBLICATIONS

Mativenga Ronnie et al: "ExTENDS: Efficient Data Placement and Management for Next Generation PCM-Based Storage Systems", IEEE Access, vol. 7, Oct. 24, 2019 (Oct. 24, 2019), pp. 148718-148730, 13 pages.

* cited by examiner

AUTO-INCREMENT WRITE COUNT FOR NONVOLATILE MEMORY

FIELD

Descriptions are generally related to nonvolatile memory devices, and more particular descriptions are related to tracking metadata for a nonvolatile memory device.

BACKGROUND

Nonvolatile (NV) memory devices have limited write endurance. NV memory refers to a memory whose state is determinate even if power to the device is interrupted. Write endurance refers to the number of times the media can be written before becoming unreliable. Additionally, the media is subject to write disturb, which is a condition where repeated access to a target memory address results in an unintended changing of the value at a victim address of an adjacent location.

With potential issues related to the number of writes, systems keep track of number of writes to determine how often to refresh the data and move data to manage cell endurance and write disturb. A traditional approach for tracking the writes is to track the writes per block. Each time data is written to a block, the system accesses the write count to increment it. In a system where the write count is stored in the nonvolatile media itself, the access requires a read of the data before the block is written. Traditionally the media controller reads the data and increments it to be written back to the media with the user data. The operation reduces the effective write bandwidth of the system.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Figure 1:
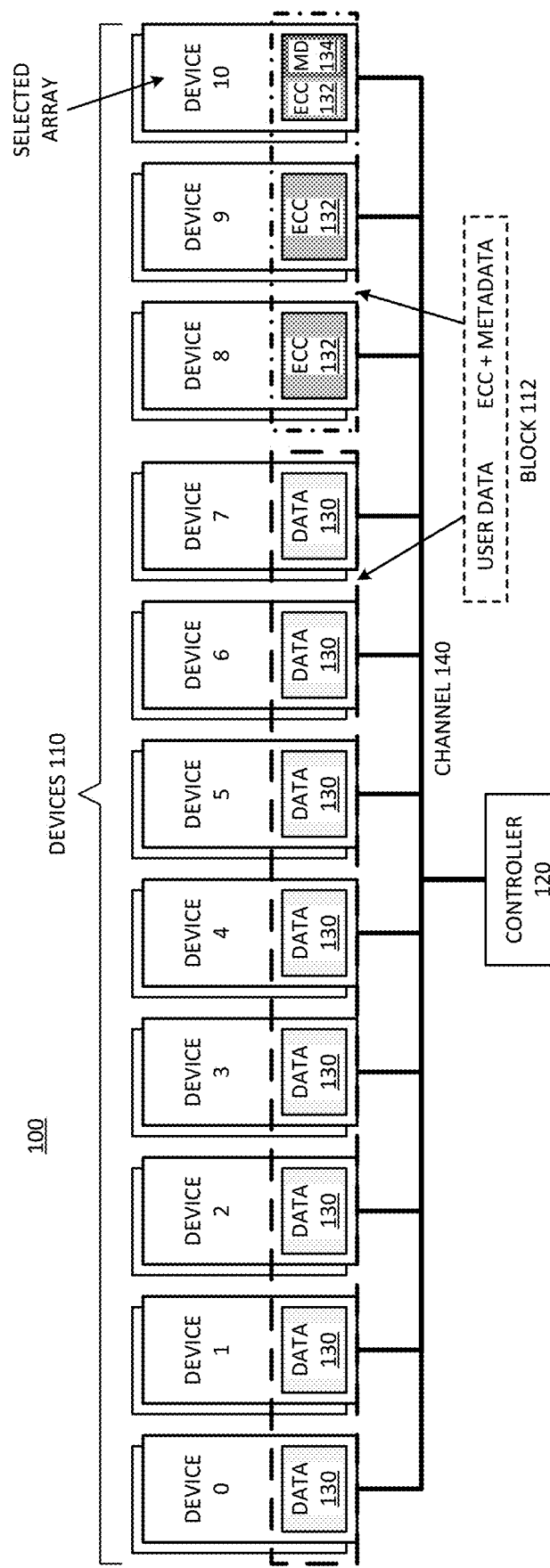
FIG. 1 is a block diagram of an example of a system having a selected memory array store write count and perform auto-increment on the write count.

Descriptions of certain details and implementations follow, including non-limiting descriptions of the figures, which may depict some or all examples, and well as other potential implementations.

DETAILED DESCRIPTION

As described herein, a system can keep track of the number of writes for a nonvolatile (NV) memory by storing metadata in one of multiple NV memory arrays. In one example, the NV memory is a memory device with three-dimensional crosspoint (3DXP) storage media. The NV memory arrays collectively store a block of data, with each array to store a portion of the data block and a selected array to store a write count for the block of data. The system can use the write count to determine how often to refresh data or move data to manage cell endurance and write disturb.

The write procedure for certain NV memory technologies takes a relatively long time and uses a lot of power. To manage energy usage and write delay, in one example the NV memory writes only bits that are changed for a write. The NV memory can issue a read operation internally in response to a write command. The internal read can be referred to as a "pre-read" or a "pre-write read," which allows the memory device to read the contents of its memory cells, compare the existing data to the incoming data, and only write the bits that are being changed.

The selected NV memory array that stores the write count will perform an internal read of its contents, which includes the write count. The selected NV memory array auto-increments the write count internally without sending the write count to the controller to be incremented. The selected NV memory array can write the incremented write count back its bitcells. In one example, the selected NV memory array writes the write count back with the user data to be written to the other NV memory arrays. The auto-increment can eliminate the need for the controller to read and increment the write count. Without the involvement of the controller, the auto-increment can save at least a read cycle issued by the controller to the NV media for each write cycle of the NV media.

In one example, the selected NV memory array that stores the write count can include an internal write count threshold. When the NV memory array increments the write count, it can also compare to the threshold and send or pass an alert to the controller when the write count threshold is reached.

In one example, the selected NV memory array performs the auto-incrementing in response to selection of a mode within the memory device. A mode refers in general to operation performed based on a configuration setting, with different operations occurring in response to the same circumstance based on the different configuration. Thus, for example, the selected NV memory array can be configured to perform auto-increment with a pre-read operation, and the other NV memory arrays are configured to simply perform the pre-read operation without auto-increment. In one example, the mode enables auto-increment hardware available in each NV memory array.

FIG. 1 is a block diagram of an example of a system having a selected memory array store write count and perform auto-increment on the write count. System 100 represents a memory system or a memory device. System 100 includes multiple memory devices 110, identified as Devices[0:10]. It will be understood that having 11 devices is an example, and other systems can have more or fewer devices. Each device illustrated can include one or more memory devices.

In one example, devices 110 represent separate NV memory arrays for system 100. In one example, the memory arrays can include 3DXP media. In one example, the memory arrays can include other NV storage media. In one example, each device 110 includes multiple arrays. In one example, each device 110 represents a separate NV memory array. In one example, each device 110 represents a separate NV memory chip or memory die. The number of devices 110 in system 100 will depend on the storage capacity of system 100, the internal architecture, and other factors. In one example, each device 110 represents a separate media die. In one example, each device 110 represents a separate media device.

In one example, system 100 represents an NV storage device such as a storage module, such as an NV dual inline memory module (DIMM). In one example, system 100 is or is part of a device such as a solid state drive (SSD). In one example, controller 120 represents a media controller for system 100. The media controller represents a control device to control access to the storage media of system 100. From the perspective of a host system in which system 100 is integrated, devices 110 are simply seen as available storage. Controller 120 as a media controller manages the access to specific devices, data address, internal commands and operations to execute a host command, compliance with timing, and other management over access to devices 110. In one example, System 100 illustrates Devices[0:7] as storing data 130. Data 130 represents user data, or data created by an associated host to be stored in system 100. In one example, Devicesz[8:9] store ECC 132, which represents error checking and correction (ECC) data for data 130. In one example, Device 10 stores ECC 132 and metadata (MD) 134. Device 10 can thus store ECC data to use with ECC 132 as well as having additional metadata for management of access to devices 110. In one example, the additional metadata 134 includes a write count to track the number of writes for block 112. Block 112 can include data 130, ECC 132, and MD 134. It will be understood from block 112 that devices 110 collectively store a block of data.

Channel 140 represents a communication channel between controller 120 and devices 110. In one example, channel 140 could be referred to as a 3DXP channel. Channel 140 enables controller 120 to communicate with devices 110. Channel 140 can include control or command signal lines as well as data signal lines.

In one example, when system 100 receives a write operation or write command from the host, controller 120 can generate commands or control within system 100 to cause device 110 to execute the write command. The command will include an address and data to be written. Controller 120 decodes the command and identifies block 112 as the address for the data to be written. In one example, controller 120 generates ECC data to write with the data received from the host. In one example, Devices[0:7] receive multiple bytes of data to be written to data 130, and controller 120 also provides ECC 132 to Devices[8:10]. In one example, controller 120 does not provide the write count to Device 10. If metadata 134 includes information other than the write count, controller 120 could provide such metadata to Device 10.

In one example, block 112 can be considered to have a codeword represented by data 130, written across multiple devices 110. In one example, Device 10 is a selected device dedicated to keep track of a write count in metadata. In one example, controller 120 identifies the locations of each device 110 and selects one device to track the metadata.

System 100 illustrates Device 10 as the selected array to store metadata 134. In one example, controller 120 provides configuration settings for each device 110, where device 110 is enabled as the selected array to perform auto-increment of the write count. Thus, the configuration setting can selectively enable or disable auto-increment for a selected memory array.

In one example, for every codewrite, or write of the codeword, devices 110 first read their respective data contents. As part of the pre-write read, in one example, Device 10 reads the write count and increments it for writing back to Device 10. In one example, Device 10 places the incremented write count on the data bus with the other data to be written.

Traditionally, the logic for tracking the write count would be included in controller 120. In one example, Device 10 includes the logic for tracking the write count. In one example, the logic is enabled when Device 10 is placed in an auto-increment mode. In one example, controller 120 sets the write count threshold (e.g., a value in a register) in connection with setting Device 10 into the auto-increment mode.

In one example, the block size for block 112 can be 64 bytes, 128 bytes, 256 bytes, or some other number of bytes for 3DXP media. A NAND (not AND) flash typically has larger block size, such as 4K or 2K bytes. The management of the write count for the block can have a higher positive performance impact for a system that has smaller block size.

Figure 2:
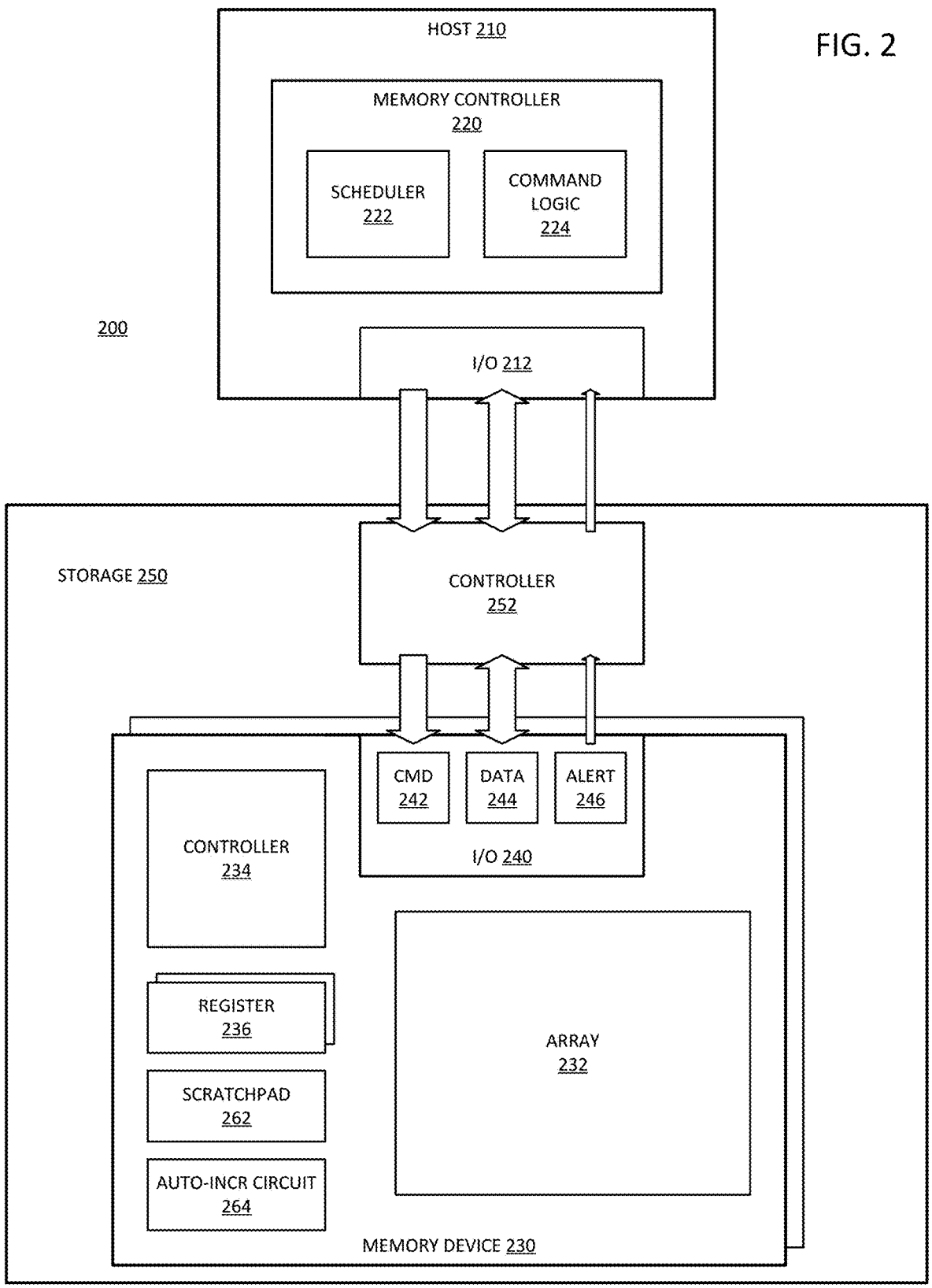
FIG. 2 is a block diagram of an example of a system having a selected memory array perform an auto-increment on write count metadata.

FIG. 2 is a block diagram of system having a selected memory array perform an auto-increment on write count metadata. System 200 provides an example of a system in accordance with system 100 of FIG. 1. Storage 250 can represent an example of system 100, where controller 252 is an example of controller 120 of system 100.

System 200 includes host 210 with memory controller 220 coupled to storage 250. Host 210 represents a computing platform to which storage 250 is coupled. For example, host 210 can be or include a computer or other computing device. Memory controller 220 represents a controller to manage access to memory device 230. In one example, memory controller 220 is part of a host processor (not specifically shown) of host 210. Memory controller 220 could alternatively be considered a storage controller, depending on the connection of storage 250.

In one example, the nonvolatile memory of memory device 230 can be coupled to a storage bus such as a peripheral component interconnect express (PCIe) bus. In one example, the nonvolatile memory of memory device 230 is nonvolatile but is also byte addressable and random access and can be coupled to a system memory bus such as a double data rate (DDR) memory bus. Host 210 includes I/O (input/output) interface 212. I/O 212 represents hardware to interface with storage 250. I/O 212 can include an interface to a command bus or command and address bus, and a data bus. In one example, the interface includes other signal lines, such as a signal line for a memory device 230 to send an alert to host 210.

Memory device 230 is illustrated having I/O 240, which represents I/O for the memory devices. While controller 252 is not specifically illustrated with I/O, it will be understood that controller 252 includes I/O hardware and firmware to receive commands and exchange data with host 210, and to interface with memory devices 230. I/O 240 includes command (CMD) 242, which represents an interface to a command bus or CA bus. Data 244 represents an interface to a data bus or DQ bus. In one example, I/O 240 includes alert 246, which represents an interface to one or more signal lines for memory device 230 to an alert to host 210. For example, when memory device 230 is a selected device to manage a write count for a group of memory devices, alert 246 enables the selected device to send an alert in response to a write count reaching a threshold.

Memory controller 220 includes scheduler 222 to manage the scheduling and sending of sequences of commands to storage 250. Scheduler 222 includes logic to determine the order of commands, as well as timing requirements for the commands. Memory controller 220 makes determinations of what commands to send in what order. Scheduler 222 determines the order of commands to ensure compliance with timing requirements.

In one example, host 210 receives an alert from memory device 230 to indicate a write threshold has been reached for a block of data. In one example, in response to the alert flag, memory controller 220 can read one or more registers of memory device 230 to identify the alert. In response to the alert, in one example, memory controller 220 determines whether to send a command to trigger an operation such as a refresh or move of data to a different storage location (e.g., a different address within the storage). If memory controller 220 determines to perform an operation in response to an alert, scheduler 222 can schedule commands to send to storage 250.

Memory controller 220 includes command logic 224 to generate commands to send to memory device 230. Commands can include Write commands or Read commands. Memory controller 220 sends read command over a command bus, which can also be referred to as a command and address bus, and after a delay period memory device 230 will drive the data on the data bus. In one example, command logic 224 can send a refresh command or a command to move data to a different location.

Storage 250 includes multiple memory devices 230. Memory device 230 includes memory array 232, which represents an array of nonvolatile memory cells or storage cells. A memory cell stores a bit of data, or multiple bits for a multilevel cell. In one example, array 232 is separated as banks of memory or other subset of memory. In one example, memory device 230 is part of a group of memory devices where one or more memory devices are organized as a rank of memory. A rank of memory is a group of memory resources that share a chip select or enable signal and are thus accessed in parallel.

In one example, array 232 includes nonvolatile memory cells. A nonvolatile (NV) memory maintains its state even when power is interrupted to the memory. A volatile memory has indeterminate state if power is interrupted to the memory. In one example, the NV media of array 232 is a 3DXP media.

System 200 includes controller 252, which represents a media controller for storage 250, which represents a memory or storage module. In one example, controller 252 receives commands and data from host 210 and determines internal commands to send to memory devices 230 for the memory devices to respond to the commands. Controller 252 can also direct specific portions of data to specific memory devices 230. System 200 also illustrates controller 234 of memory device 230. Controller 234 represents logic at the memory device to receive and decode commands, and can drive the circuitry needed to respond to a command.

Memory device 230 includes register 236, which represents one or more registers or storage locations to store configuration information or values related to the operation of memory device 230. In one example, register 236 includes one or more mode registers. In one example, register 236 includes configuration information to control a write count auto-increment mode for memory device 230.

In one example, memory device 230 includes scratchpad 262, which represents a temporary storage location for memory device 230 to use for internal operations. In one example, memory device 230 performs a pre-write read operation in response to a write command. The pre-write read operation can include reading the contents of an address of array 232 and comparing to a buffered copy of the data to be written. The write buffer is not specifically shown, but provides a temporary buffer for the data to be exchanged with array 232. In one example, the buffer can be considered inline to the data bus in that the buffer connects to the data paths to exchange data between array 232 and the data bus.

In one example, the compare generates a result that can be stored in scratchpad 262. Scratchpad 262 represents storage for an internal operation that is not sent to controller 252. Auto-increment circuit 264 represents hardware to enable auto-increment, such as logic circuits to perform the incrementing of the value and combining it back with the user data and ECC data to be written back to the memory array. In one example, auto-increment circuit 264 can be dynamically enabled and disabled based on configuration of memory device 230. Namely, when memory device 230 is configured as the selected write count array, auto-increment circuit 264 can be enabled to perform the auto-increment operation on the write count.

Figure 3:
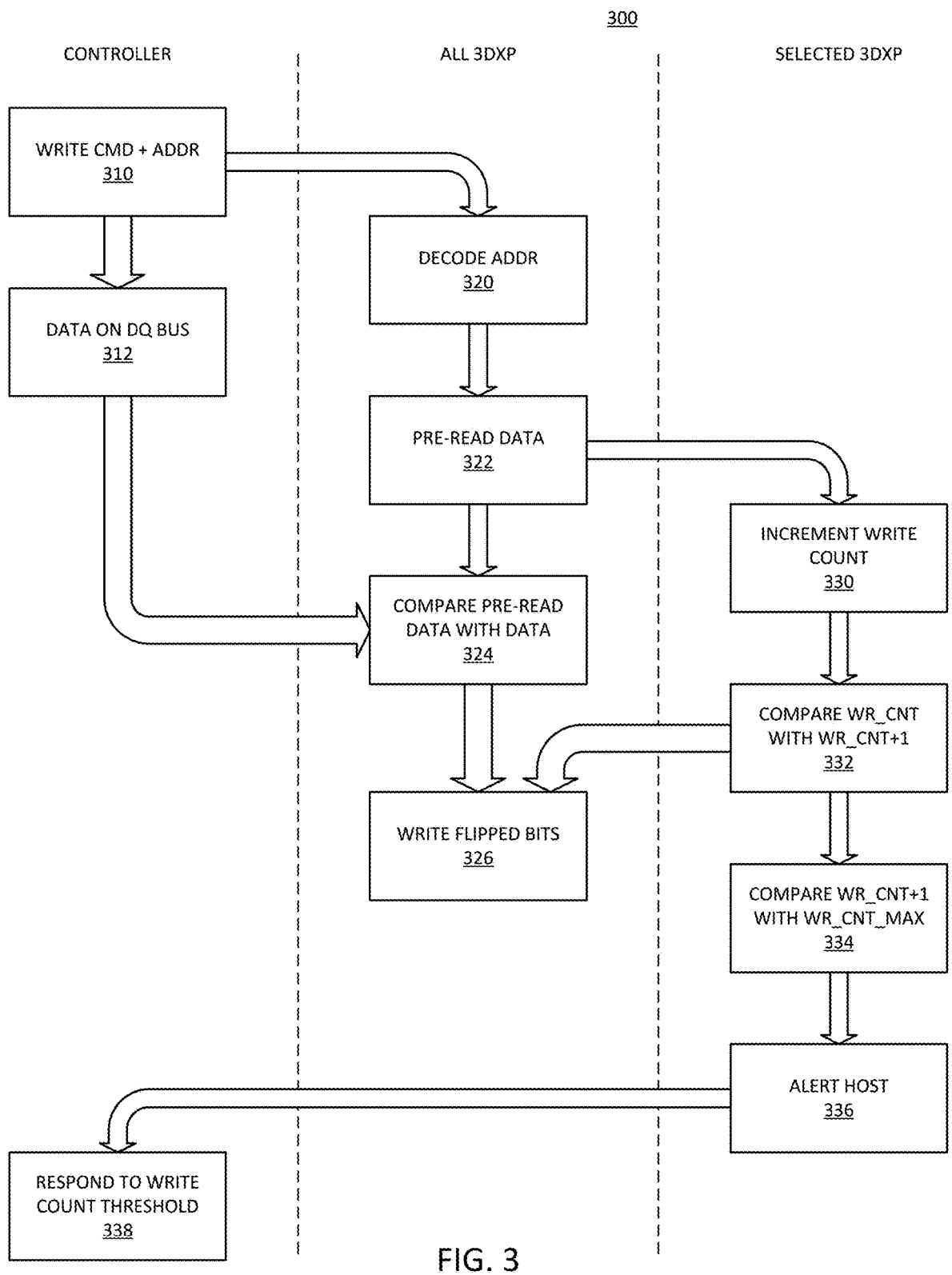
FIG. 3 is a block diagram of an implementation of performing auto-increment on write count metadata.

FIG. 3 is a block diagram of an implementation of performing auto-increment on write count metadata. Diagram 300 represents a flow that can be implemented by a system in accordance with a nonvolatile memory system described.

In one example, the controller represents a media controller and 3DXP represents a NV memory device. The middle column represents operations performed by all 3DXP or all memory arrays or memory devices. The right column represents operations to be performed by a selected 3DXP device.

The controller generates a write command and address (ADDR) for the write command, block 310. In one example, in response to the write command, all 3DXP devices decode the address of the command, block 320. After sending the command, the controller sends the data on the DQ bus after an appropriate delay, block 312. The delay is a write delay defined for the 3DXP media.

In one example, in response to decoding the command, all 3DXP devices pre-read their current data contents, block 322. The 3DXP devices compare the pre-read data with the received data on the DQ bus, block 324.

One of the 3DXP devices is selected as a selected 3DXP device to manage the write count. In one example, the selected 3DXP is configured into an auto-increment mode. Such a mode could be configured, in one example, by setting a register or configuration bit. For example, a configuration field or configuration bit could be auto-increment=0 for non-selected 3DXP devices and auto-increment=1 for the selected device.

In one example, the selected 3DXP increments the write count, block 330. In one example, the selected 3DXP device compares the current write count (WR_CNT) with the incremented write count (WR_CNT+1), block 332. In one example, the selected 3DXP stores ECC data or user data in addition to the write count. Thus, the selected 3DXP could perform the comparison of the pre-read data with the data on the DQ bus.

In one example, for the selected 3DXP device, the auto-increment write count mode is enabled, which means the system can ignore specific N bytes (e.g., two or three bytes) of the DQ bus for a write command. Thus, for example, collectively the 3DXP devices of one example could perform a compare of PRE_RD[15:3] with DQ_BUS[15:3], where PRE_RD[15:3] represents 14 bytes of data read from the memory arrays of the 3DXP devices (which could include data from the selected 3DXP device) and DQ_BUS [15:3] represents 14 bytes of data received from the host. The last three bytes of the DQ bus could be ignored. The selected 3DXP device can perform a compare of PRE_RD [2:0] with (PRE_RD[2:0]+1), where PRE_RD[2:0] represents the write count metadata and (PRE_RD[2:0]+1) represents the incremented write count.

In one example, the 3DXP devices only write data that is changed in response to a write command. In one example, whether the comparison of the user data, the ECC data, or the write count metadata, the 3DXP devices place the data back on the bus. For example, the devices can place the comparison of the data into a write buffer to be compared for flipped bits. In one example, the 3DXP devices only write the flipped bits, block 326.

In one example, the selected 3DXP device compares the incremented write count (WR_CNT+1) to a threshold count (WR_CNT_MAX), block 334. In one example, if the threshold is reached, the 3DXP device alerts the host, block 336. In one example, the media controller sets the threshold or the write count limit by configuration register (such as a mode register). Thus, the selected 3DXP can set a flag or other alert if the count reaches the threshold. In response to the alert, the media controller can take proper action to respond to the write count reaching the threshold, block 338.

Figure 4:
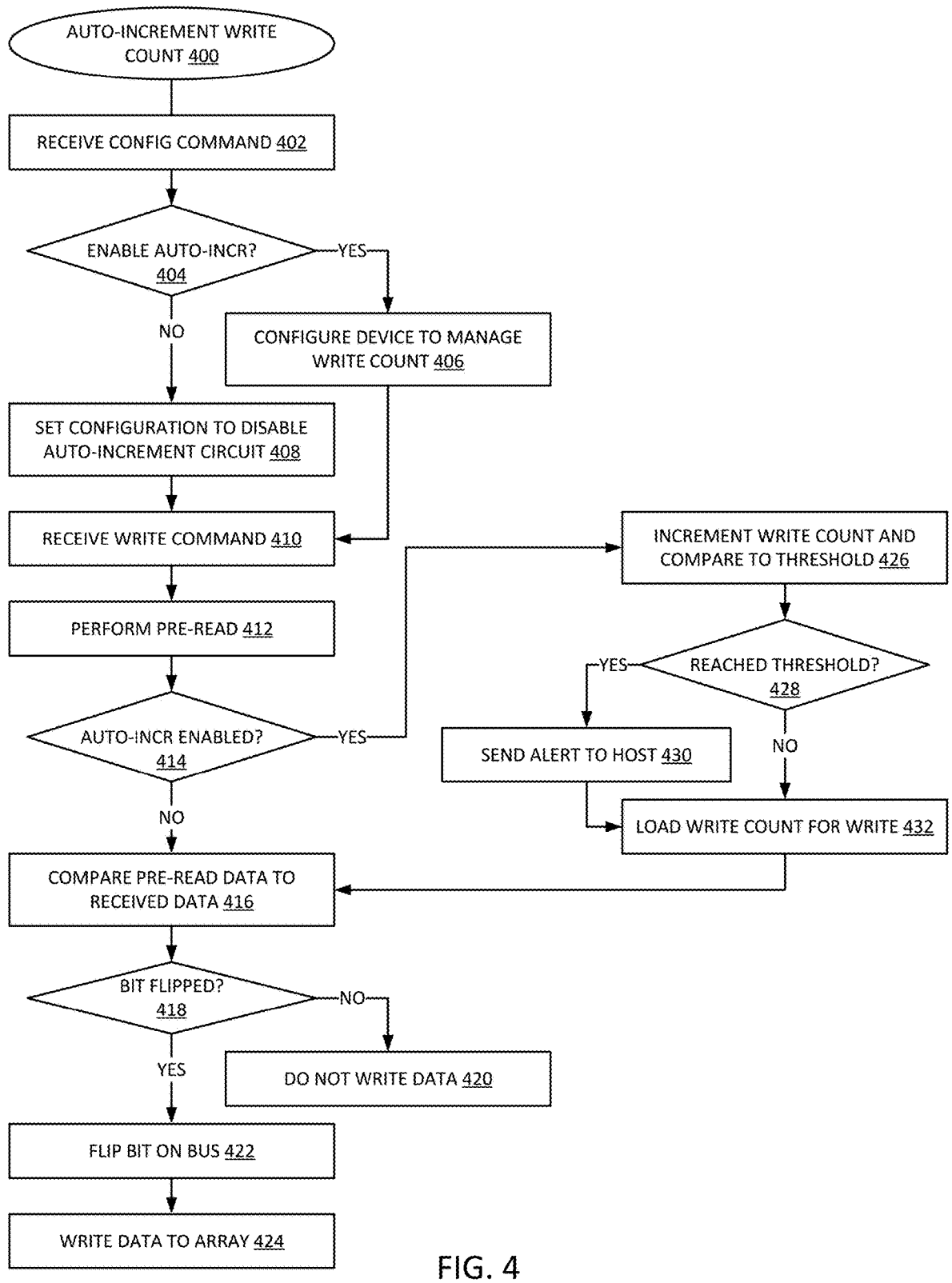
FIG. 4 is a flow diagram of an example of a process for write count auto-increment.

FIG. 4 is a flow diagram of an example of a process for write count auto-increment. Process 400 for an auto-increment write count can be performed by an example of a system in accordance with system 100 of FIG. 1, or system 200 of FIG. 2.

In one example, a nonvolatile memory device, such as a 3DXP device, receives a configuration command from a host controller, at 402. The configuration command can set the NV memory device to perform auto-increment when the NV memory device is the one selected to store the write count.

If the configuration command is to enable auto-increment, at 404 YES branch, in one example, the command configures a selected device to manage the write count, at 406. If the configuration command is not to enable auto-increment, at 404 NO branch, the device is not selected to manage the write count. If the device is not to manage the write count metadata, in one example, the configuration disables an auto-increment circuit on the device, at 408. Thus, all devices could include auto-increment circuitry, and one selected device has the capability enabled and the other devices have the capability disabled.

Whichever configuration is set for the memory devices, the memory devices can be ready to receive access commands. In response to receiving a write command or in response to receipt of the command, at 410, in one example, the memory devices perform a pre-read of the data they have stored at the address associated with the write command, at 412.

For multiple memory devices, there will be one device selected to manage the write count. Thus, the typical case will be for standard operation, and one device will have other operation to manage the write count. When auto-increment is not enabled, at 414 NO branch, in one example, the memory device compares the pre-read data to the received data for the write command, at 416.

In one example, the memory device performs a compare of the current data contents (the pre-read data) with the data to be written because the device only writes the delta or the bits that will be flipped due to the write command. Thus, in one example, the memory devices each determine for each bit of data to be written whether the bit is flipped. If the bit is not flipped, at 418 NO branch, in one example, the device does not perform a write for an unchanged bit, 420.

If the bit is flipped, at 418 YES branch, in one example, the device flips the bit on the data bus, at 422. Thus, the device can place the results of the compare onto the data bus for writing to the memory array. In one example, the pre-read data is not placed on the data bus but is used only for the compare, with the results placed on the data bus to be written. Once the data on the data bus is set, the device writes the data to the array, at 424.

For the device that stores the write count, auto-increment is enabled, at 414 YES branch. In one example, the selected device increments the write count and compares the incremented write count to a threshold, at 426. The threshold can be a threshold to indicate risk of write disturb, a threshold to indicate end of life, or some other threshold. In one example, the device compares the incremented value to multiple different thresholds.

If one or more thresholds have been reached, at 428 YES branch, in one example, the device sends an alert to the host, at 430. In one example, if multiple thresholds are compared, the device can send different alerts for different thresholds. In one example, the device sends a single alert and the host queries the device to determine the source of the alert. Whether or not a threshold has been reached, in one example, after incrementing the write count, the device can load the incremented write count for writing back to the array, at 432. The write count can be considered pre-read data and the incremented write count can be in place of write data from the DQ bus to compare for flipped bits for the selected device, returning the process to 416.

Figure 5:
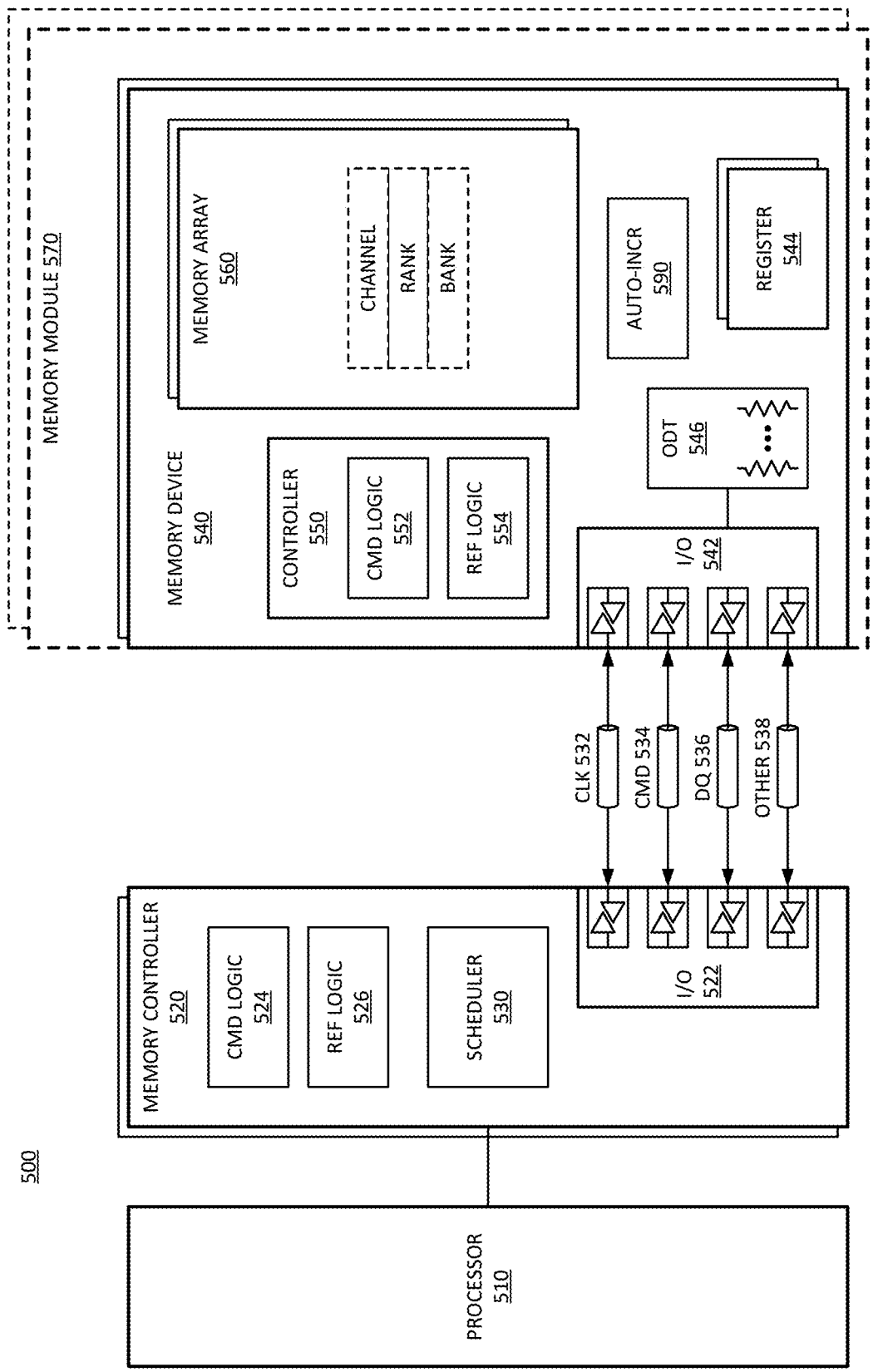
FIG. 5 is a block diagram of an example of a memory subsystem in which write count auto-increment can be implemented.

FIG. 5 is a block diagram of an example of a memory subsystem in which write count auto-increment can be implemented. System 500 includes a processor and elements of a memory subsystem in a computing device. System 500 provides an example of a system in accordance with system 100 of FIG. 1 or system 200 of FIG. 2.

In one example, system 500 includes auto-increment logic 590 in memory device 540. In one example, memory device 540 can be selected from among multiple memory devices of memory module 570 to manage a block write count for a block of memory, in accordance with any example herein. In one example, memory device 540 stores write count metadata in memory array 560. In one example, register 544 includes a field to be written to determine whether memory device 540 is the selected memory device for managing the write count. In one example, auto-increment logic 590 includes hardware to perform the auto-increment of the write count.

Processor 510 represents a processing unit of a computing platform that may execute an operating system (OS) and applications, which can collectively be referred to as the host or the user of the memory. The OS and applications execute operations that result in memory accesses. Processor 510 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 500 can be implemented as an SOC (system on a chip), or be implemented with standalone components.

In one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices. A memory device can include a nonvolatile, byte addressable media that stores data based on a resistive state of the memory cell, or a phase of the memory cell. In one example, the memory device can use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Memory controller 520 represents one or more memory controller circuits or devices for system 500. Memory controller 520 represents control logic that generates memory access commands in response to the execution of operations by processor 510. Memory controller 520 accesses one or more memory devices 540. Memory devices 540 can be DRAM devices in accordance with any referred to above. In one example, memory devices 540 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 520 manages a separate memory channel, although system 500 can be configured to have multiple channels managed by a single controller, or to have multiple controllers on a single channel. In one example, memory controller 520 is part of host processor or host processor device 510, such as logic implemented on the same die or implemented in the same package space as the processor.

Memory controller 520 includes I/O interface logic 522 to couple to a memory bus, such as a memory channel as referred to above. I/O interface logic 522 (as well as I/O interface logic 542 of memory device 540) can include pins, pads, connectors, signal lines, traces, or wires, or other hardware to connect the devices, or a combination of these. I/O interface logic 522 can include a hardware interface. As illustrated, I/O interface logic 522 includes at least drivers/transceivers for signal lines. Commonly, wires within an integrated circuit interface couple with a pad, pin, or connector to interface signal lines or traces or other wires between devices. I/O interface logic 522 can include drivers, receivers, transceivers, or termination, or other circuitry or combinations of circuitry to exchange signals on the signal lines between the devices. The exchange of signals includes at least one of transmit or receive. While shown as coupling I/O 522 from memory controller 520 to I/O 542 of memory device 540, it will be understood that in an implementation of system 500 where groups of memory devices 540 are accessed in parallel, multiple memory devices can include I/O interfaces to the same interface of memory controller 520. In an implementation of system 500 including one or more memory modules 570, I/O 542 can include interface hardware of the memory module in addition to interface hardware on the memory device itself. Other memory controllers 520 will include separate interfaces to other memory devices 540.

The bus between memory controller 520 and memory devices 540 can be implemented as multiple signal lines coupling memory controller 520 to memory devices 540. The bus may typically include at least clock (CLK) 532, command/address (CMD) 534, and write data (DQ) and read data (DQ) 536, and zero or more other signal lines 538. In one example, a bus or connection between memory controller 520 and memory can be referred to as a memory bus. In one example, the memory bus is a multi-drop bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 500 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 520 and memory devices 540. An example of a serial bus technology is 8B10B encoding and transmission of high-speed data with embedded clock over a single differential pair of signals in each direction. In one example, CMD 534 represents signal lines shared in parallel with multiple memory devices. In one example, multiple memory devices share encoding command signal lines of CMD 534, and each has a separate chip select (CS_n) signal line to select individual memory devices.

It will be understood that in the example of system 500, the bus between memory controller 520 and memory devices 540 includes a subsidiary command bus CMD 534 and a subsidiary bus to carry the write and read data, DQ 536. In one example, the data bus can include bidirectional lines for read data and for write/command data. In another example, the subsidiary bus DQ 536 can include unidirectional write signal lines for write and data from the host to memory, and can include unidirectional lines for read data from the memory to the host. In accordance with the chosen memory technology and system design, other signals 538 may accompany a bus or sub bus, such as strobe lines DQS. Based on design of system 500, or implementation if a design supports multiple implementations, the data bus can have more or less bandwidth per memory device 540. For example, the data bus can support memory devices that have either a x4 interface, a x8 interface, a x16 interface, or other interface. The convention "xW," where W is an integer that refers to an interface size or width of the interface of memory device 540, which represents a number of signal lines to exchange data with memory controller 520. The interface size of the memory devices is a controlling factor on how many memory devices can be used concurrently per channel in system 500 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 540 and memory controller 520 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length eight (BL8), and each memory device 540 can transfer data on each UI. Thus, a x8 memory device operating on BL8 can transfer 54 bits of data (8 data signal lines times 8 data bits transferred per line over the burst). It will be understood that this simple example is merely an illustration and is not limiting.

Memory devices 540 represent memory resources for system 500. In one example, each memory device 540 is a separate memory die. In one example, each memory device 540 can interface with multiple (e.g., 2) channels per device or die. Each memory device 540 includes I/O interface logic 542, which has a bandwidth determined by the implementation of the device (e.g., x16 or x8 or some other interface bandwidth). I/O interface logic 542 enables the memory devices to interface with memory controller 520. I/O interface logic 542 can include a hardware interface, and can be in accordance with I/O 522 of memory controller, but at the memory device end. In one example, multiple memory devices 540 are connected in parallel to the same command and data buses. In another example, multiple memory devices 540 are connected in parallel to the same command bus, and are connected to different data buses. For example, system 500 can be configured with multiple memory devices 540 coupled in parallel, with each memory device responding to a command, and accessing memory resources 560 internal to each. For a Write operation, an individual memory device 540 can write a portion of the overall data word, and for a Read operation, an individual memory device 540 can fetch a portion of the overall data word. The remaining bits of the word will be provided or received by other memory devices in parallel.

In one example, memory devices 540 are disposed directly on a motherboard or host system platform (e.g., a PCB (printed circuit board) on which processor 510 is disposed) of a computing device. In one example, memory devices 540 can be organized into memory modules 570. In one example, memory modules 570 represent dual inline memory modules (DIMMs). In one example, memory modules 570 represent other organization of multiple memory devices to share at least a portion of access or control circuitry, which can be a separate circuit, a separate device, or a separate board from the host system platform. Memory modules 570 can include multiple memory devices 540, and the memory modules can include support for multiple separate channels to the included memory devices disposed on them. In another example, memory devices 540 may be incorporated into the same package as memory controller 520, such as by techniques such as multi-chip-module (MCM), package-on-package, through-silicon via (TSV), or other techniques or combinations. Similarly, in one example, multiple memory devices 540 may be incorporated into memory modules 570, which themselves may be incorporated into the same package as memory controller 520. It will be appreciated that for these and other implementations, memory controller 520 may be part of host processor 510.

Memory devices 540 each include one or more memory arrays 560. Memory array 560 represents addressable memory locations or storage locations for data. Typically, memory array 560 is managed as rows of data, accessed via wordline (rows) and bitline (individual bits within a row) control. Memory array 560 can be organized as separate channels, ranks, banks, and partitions of memory. Channels may refer to independent control paths to storage locations within memory devices 540. Ranks may refer to common locations across multiple memory devices (e.g., same row addresses within different devices) in parallel. Banks may refer to sub-arrays of memory locations within a memory device 540. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 540 include one or more registers 544. Register 544 represents one or more storage devices or storage locations that provide configuration or settings for the operation of the memory device. In one example, register 544 can provide a storage location for memory device 540 to store data for access by memory controller 520 as part of a control or management operation. In one example, register 544 includes one or more Mode Registers. In one example, register 544 includes one or more multipurpose registers. The configuration of locations within register 544 can configure memory device 540 to operate in different "modes," where command information can trigger different operations within memory device 540 based on the mode. Additionally or in the alternative, different modes can also trigger different operation from address information or other signal lines depending on the mode. Settings of register 544 can indicate configuration for I/O settings (e.g., timing, termination or ODT (on-die termination) 546, driver configuration, or other I/O settings).

In one example, memory device 540 includes ODT 546 as part of the interface hardware associated with I/O 542. ODT 546 can be configured as mentioned above, and provide settings for impedance to be applied to the interface to specified signal lines. In one example, ODT 546 is applied to DQ signal lines. In one example, ODT 546 is applied to command signal lines. In one example, ODT 546 is applied to address signal lines. In one example, ODT 546 can be applied to any combination of the preceding. The ODT settings can be changed based on whether a memory device is a selected target of an access operation or a non-target device. ODT 546 settings can affect the timing and reflections of signaling on the terminated lines. Careful control over ODT 546 can enable higher-speed operation with improved matching of applied impedance and loading. ODT 546 can be applied to specific signal lines of I/O interface 542, 522 (for example, ODT for DQ lines or ODT for CA lines), and is not necessarily applied to all signal lines.

Memory device 540 includes controller 550, which represents control logic within the memory device to control internal operations within the memory device. For example, controller 550 decodes commands sent by memory controller 520 and generates internal operations to execute or satisfy the commands. Controller 550 can be referred to as an internal controller, and is separate from memory controller 520 of the host. Controller 550 can determine what mode is selected based on register 544, and configure the internal execution of operations for access to memory resources 560 or other operations based on the selected mode. Controller 550 generates control signals to control the routing of bits within memory device 540 to provide a proper interface for the selected mode and direct a command to the proper memory locations or addresses. Controller 550 includes command logic 552, which can decode command encoding received on command and address signal lines. Thus, command logic 552 can be or include a command decoder. With command logic 552, memory device can identify commands and generate internal operations to execute requested commands.

Referring again to memory controller 520, memory controller 520 includes command (CMD) logic 524, which represents logic or circuitry to generate commands to send to memory devices 540. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 540, memory controller 520 can issue commands via I/O 522 to cause memory device 540 to execute the commands. In one example, controller 550 of memory device 540 receives and decodes command and address information received via I/O 542 from memory controller 520. Based on the received command and address information, controller 550 can control the timing of operations of the logic and circuitry within memory device 540 to execute the commands. Controller 550 is responsible for compliance with standards or specifications within memory device 540, such as timing and signaling requirements. Memory controller 520 can implement compliance with standards or specifications by access scheduling and control.

Memory controller 520 includes scheduler 530, which represents logic or circuitry to generate and order transactions to send to memory device 540. From one perspective, the primary function of memory controller 520 could be said to schedule memory access and other transactions to memory device 540. Such scheduling can include generating the transactions themselves to implement the requests for data by processor 510 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 520 typically includes logic such as scheduler 530 to allow selection and ordering of transactions to improve performance of system 500. Thus, memory controller 520 can select which of the outstanding transactions should be sent to memory device 540 in which order, which is typically achieved with logic much more complex that a simple first-in first-out algorithm. Memory controller 520 manages the transmission of the transactions to memory device 540, and manages the timing associated with the transaction. In one example, transactions have deterministic timing, which can be managed by memory controller 520 and used in determining how to schedule the transactions with scheduler 530.

In one example, memory controller 520 includes refresh (REF) logic 526. Refresh logic 526 can be used to refresh memory resources to retain a deterministic state. Volatile memory resources need to be refreshed regularly to maintain state, while nonvolatile memory resources may need to be refreshed to avoid read/write disturb. In one example, refresh logic 526 indicates a location for refresh, and a type of refresh to perform. Refresh logic 526 can trigger self-refresh within memory device 540, or execute external refreshes (which can be referred to as auto refresh commands) by sending refresh commands, or a combination. In one example, controller 550 within memory device 540 includes refresh logic 554 to apply refresh within memory device 540. Refresh logic 554 generates internal operations to perform refresh either internally, or in accordance with an external refresh received from memory controller 520.

Figure 6:
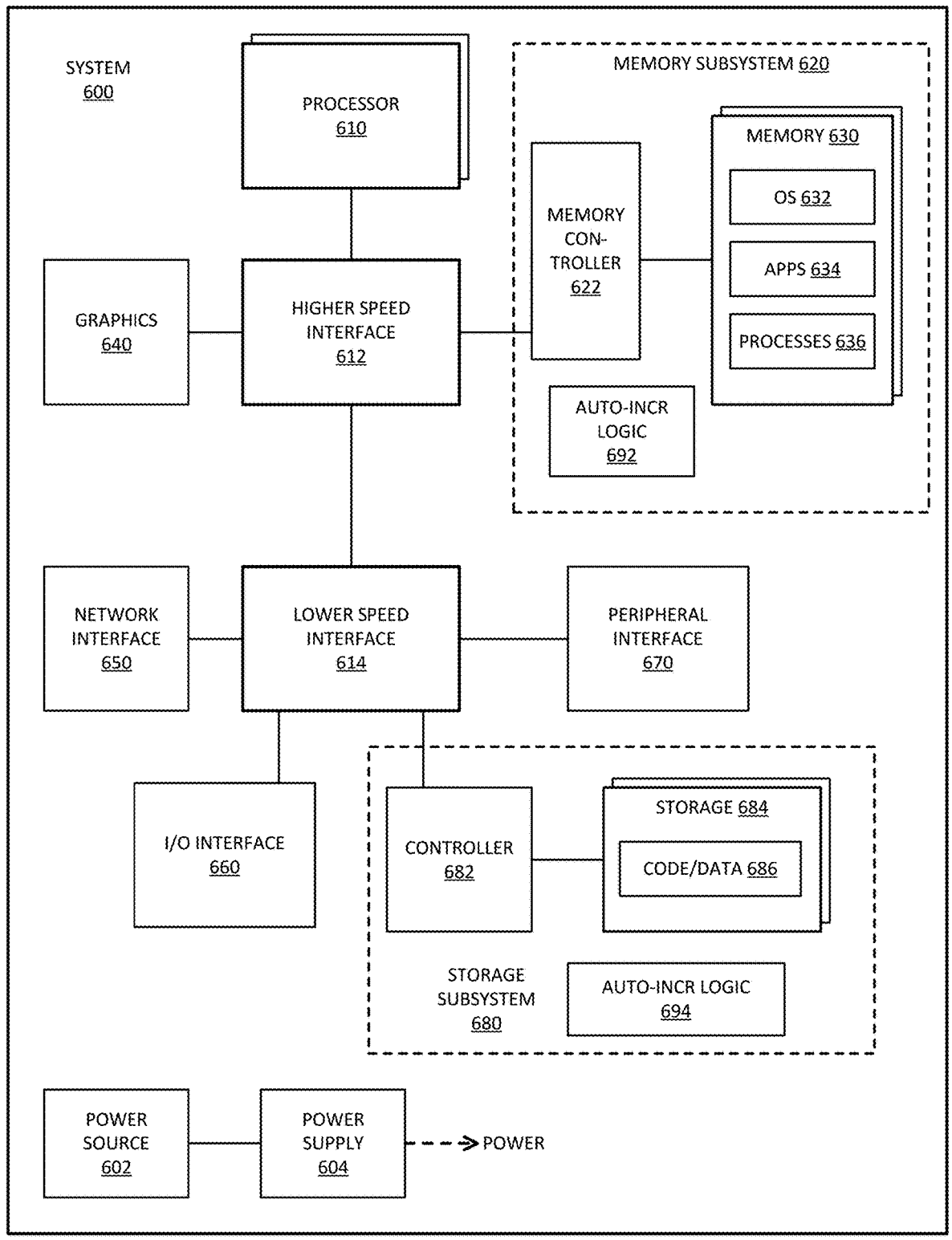
FIG. 6 is a block diagram of an example of a computing system in which write count auto-increment can be implemented.

FIG. 6 is a block diagram of an example of a computing system in which write count auto-increment can be implemented. System 600 represents a computing device in accordance with any example herein, and can be a laptop computer, a desktop computer, a tablet computer, a server, a gaming or entertainment control system, embedded computing device, or other electronic device. System 600 provides an example of a system in accordance with system 100 of FIG. 1 or system 200 of FIG. 2.

In one example, system 600 includes auto-increment logic 692 in memory subsystem 620 or auto-increment logic 694 in storage subsystem 680, or includes both. In one example, one NV memory device or NV memory array of memory 630, or one NV memory device of storage 684 can be selected from among multiple devices to manage a block write count for a block of memory, in accordance with any example herein. In one example, the selected NV memory device or NV memory array stores write count metadata. In one example, the selected device is selected based on a configuration mode configured for managing the write count. In one example, auto-increment logic 692 or auto-increment logic 694 includes hardware to perform the auto-increment of the write count.

System 600 includes processor 610 can include any type of microprocessor, central processing unit (CPU), graphics processing unit (GPU), processing core, or other processing hardware, or a combination, to provide processing or execution of instructions for system 600. Processor 610 controls the overall operation of system 600, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 600 includes interface 612 coupled to processor 610, which can represent a higher speed interface or a high throughput interface for system components that need higher bandwidth connections, such as memory subsystem 620 or graphics interface components 640. Interface 612 represents an interface circuit, which can be a standalone component or integrated onto a processor die. Interface 612 can be integrated as a circuit onto the processor die or integrated as a component on a system on a chip. Where present, graphics interface 640 interfaces to graphics components for providing a visual display to a user of system 600. Graphics interface 640 can be a standalone component or integrated onto the processor die or system on a chip. In one example, graphics interface 640 can drive a high definition (HD) display or ultra high definition (UHD) display that provides an output to a user. In one example, the display can include a touchscreen display. In one example, graphics interface 640 generates a display based on data stored in memory 630 or based on operations executed by processor 610 or both.

Memory subsystem 620 represents the main memory of system 600, and provides storage for code to be executed by processor 610, or data values to be used in executing a routine. Memory subsystem 620 can include one or more memory devices 630 such as read-only memory (ROM), flash memory, one or more varieties of random access memory (RAM) such as DRAM, 3DXP (three-dimensional crosspoint), or other memory devices, or a combination of such devices. Memory 630 stores and hosts, among other things, operating system (OS) 632 to provide a software platform for execution of instructions in system 600. Additionally, applications 634 can execute on the software platform of OS 632 from memory 630. Applications 634 represent programs that have their own operational logic to perform execution of one or more functions. Processes 636 represent agents or routines that provide auxiliary functions to OS 632 or one or more applications 634 or a combination. OS 632, applications 634, and processes 636 provide software logic to provide functions for system 600. In one example, memory subsystem 620 includes memory controller 622, which is a memory controller to generate and issue commands to memory 630. It will be understood that memory controller 622 could be a physical part of processor 610 or a physical part of interface 612. For example, memory controller 622 can be an integrated memory controller, integrated onto a circuit with processor 610, such as integrated onto the processor die or a system on a chip.

While not specifically illustrated, it will be understood that system 600 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 600 includes interface 614, which can be coupled to interface 612. Interface 614 can be a lower speed interface than interface 612. In one example, interface 614 represents an interface circuit, which can include standalone components and integrated circuitry. In one example, multiple user interface components or peripheral components, or both, couple to interface 614. Network interface 650 provides system 600 the ability to communicate with remote devices (e.g., servers or other computing devices) over one or more networks. Network interface 650 can include an Ethernet adapter, wireless interconnection components, cellular network interconnection components, USB (universal serial bus), or other wired or wireless standards-based or proprietary interfaces. Network interface 650 can exchange data with a remote device, which can include sending data stored in memory or receiving data to be stored in memory.

In one example, system 600 includes one or more input/output (I/O) interface(s) 660. I/O interface 660 can include one or more interface components through which a user interacts with system 600 (e.g., audio, alphanumeric, tactile/touch, or other interfacing). Peripheral interface 670 can include any hardware interface not specifically mentioned above. Peripherals refer generally to devices that connect dependently to system 600. A dependent connection is one where system 600 provides the software platform or hardware platform or both on which operation executes, and with which a user interacts.

In one example, system 600 includes storage subsystem 680 to store data in a nonvolatile manner. In one example, in certain system implementations, at least certain components of storage 680 can overlap with components of memory subsystem 620. Storage subsystem 680 includes storage device(s) 684, which can be or include any conventional medium for storing large amounts of data in a nonvolatile manner, such as one or more magnetic, solid state, 3DXP, or optical based disks, or a combination. Storage 684 holds code or instructions and data 686 in a persistent state (i.e., the value is retained despite interruption of power to system 600). Storage 684 can be generically considered to be a "memory," although memory 630 is typically the executing or operating memory to provide instructions to processor 610. Whereas storage 684 is nonvolatile, memory 630 can include volatile memory (i.e., the value or state of the data is indeterminate if power is interrupted to system 600). In one example, storage subsystem 680 includes controller 682 to interface with storage 684. In one example controller 682 is a physical part of interface 614 or processor 610, or can include circuits or logic in both processor 610 and interface 614.

Power source 602 provides power to the components of system 600. More specifically, power source 602 typically interfaces to one or multiple power supplies 604 in system 600 to provide power to the components of system 600. In one example, power supply 604 includes an AC to DC (alternating current to direct current) adapter to plug into a wall outlet. Such AC power can be renewable energy (e.g., solar power) power source 602. In one example, power source 602 includes a DC power source, such as an external AC to DC converter. In one example, power source 602 or power supply 604 includes wireless charging hardware to charge via proximity to a charging field. In one example, power source 602 can include an internal battery or fuel cell source.

Figure 7:
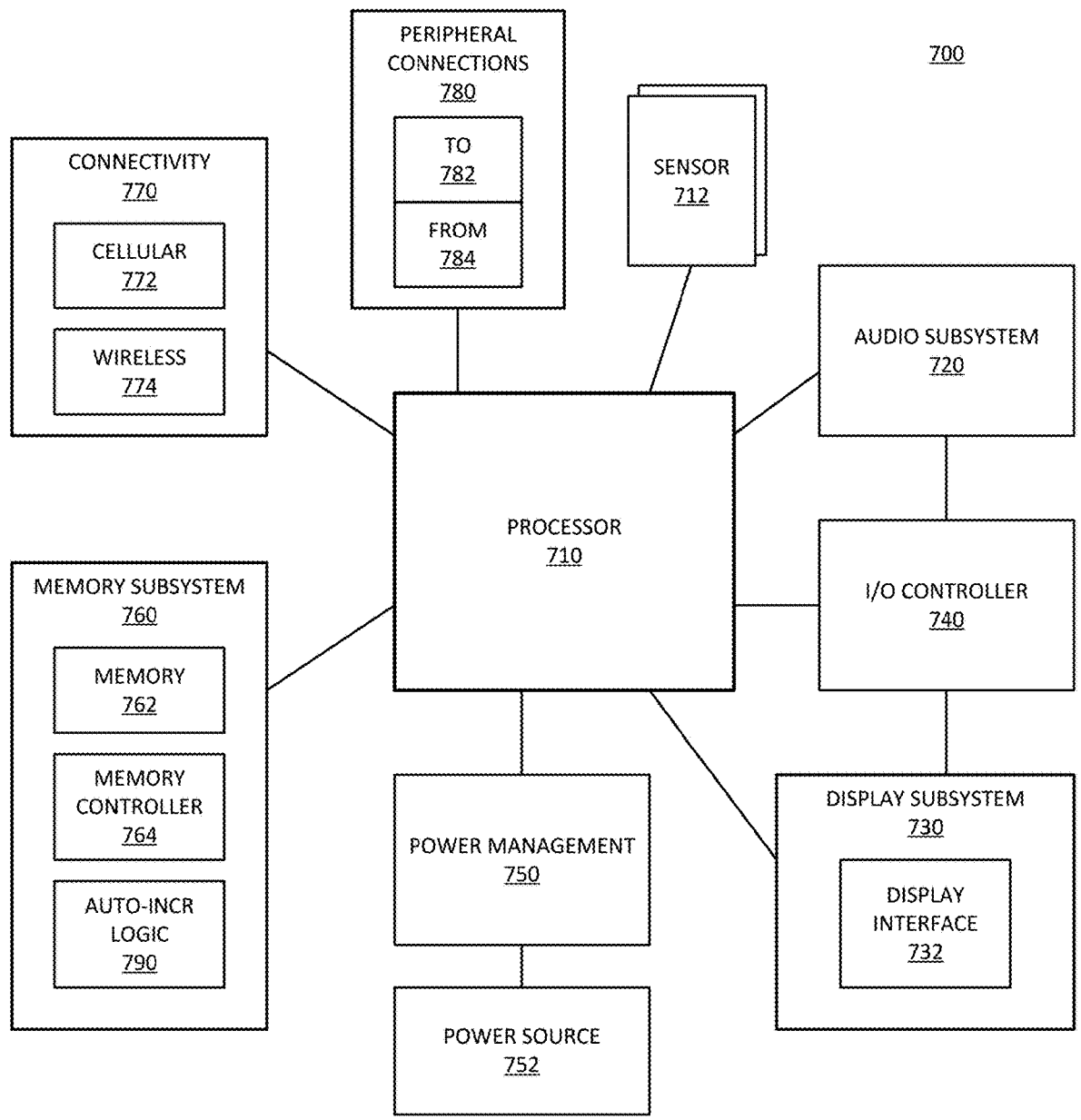
FIG. 7 is a block diagram of an example of a mobile device in which write count auto-increment can be implemented.

FIG. 7 is a block diagram of an example of a mobile device in which write count auto-increment can be implemented. System 700 represents a mobile computing device, such as a computing tablet, a mobile phone or smartphone, wearable computing device, or other mobile device, or an embedded computing device. It will be understood that certain of the components are shown generally, and not all components of such a device are shown in system 700.

System 700 provides an example of a system in accordance with system 100 of FIG. 1 or system 200 of FIG. 2.

In one example, system 700 includes auto-increment logic 790 in memory subsystem 760. In one example, one NV memory device or NV memory array of memory 762 can be selected from among multiple devices to manage a block write count for a block of memory, in accordance with any example herein. In one example, the selected NV memory device or NV memory array stores write count metadata. In one example, the selected device is selected based on a configuration mode configured for managing the write count. In one example, auto-increment logic 790 includes hardware to perform the auto-increment of the write count.

System 700 includes processor 710, which performs the primary processing operations of system 700. Processor 710 can include one or more physical devices, such as microprocessors, application processors, microcontrollers, programmable logic devices, or other processing means. The processing operations performed by processor 710 include the execution of an operating platform or operating system on which applications and device functions are executed. The processing operations include operations related to I/O (input/output) with a human user or with other devices, operations related to power management, operations related to connecting system 700 to another device, or a combination. The processing operations can also include operations related to audio I/O, display I/O, or other interfacing, or a combination. Processor 710 can execute data stored in memory. Processor 710 can write or edit data stored in memory.

In one example, system 700 includes one or more sensors 712. Sensors 712 represent embedded sensors or interfaces to external sensors, or a combination. Sensors 712 enable system 700 to monitor or detect one or more conditions of an environment or a device in which system 700 is implemented. Sensors 712 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 712 can also include sensors for biometric systems such as fingerprint recognition systems, face detection or recognition systems, or other systems that detect or recognize user features. Sensors 712 should be understood broadly, and not limiting on the many different types of sensors that could be implemented with system 700. In one example, one or more sensors 712 couples to processor 710 via a frontend circuit integrated with processor 710. In one example, one or more sensors 712 couples to processor 710 via another component of system 700.

In one example, system 700 includes audio subsystem 720, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 700, or connected to system 700. In one example, a user interacts with system 700 by providing audio commands that are received and processed by processor 710.

Display subsystem 730 represents hardware (e.g., display devices) and software components (e.g., drivers) that provide a visual display for presentation to a user. In one example, the display includes tactile components or touchscreen elements for a user to interact with the computing device. Display subsystem 730 includes display interface 732, which includes the particular screen or hardware device used to provide a display to a user. In one example, display interface 732 includes logic separate from processor 710 (such as a graphics processor) to perform at least some processing related to the display. In one example, display subsystem 730 includes a touchscreen device that provides both output and input to a user. In one example, display subsystem 730 includes a high definition (HD) or ultra-high definition (UHD) display that provides an output to a user. In one example, display subsystem includes or drives a touchscreen display. In one example, display subsystem 730 generates display information based on data stored in memory or based on operations executed by processor 710 or both.

I/O controller 740 represents hardware devices and software components related to interaction with a user. I/O controller 740 can operate to manage hardware that is part of audio subsystem 720, or display subsystem 730, or both. Additionally, I/O controller 740 illustrates a connection point for additional devices that connect to system 700 through which a user might interact with the system. For example, devices that can be attached to system 700 might include microphone devices, speaker or stereo systems, video systems or other display device, keyboard or keypad devices, buttons/switches, or other I/O devices for use with specific applications such as card readers or other devices.

As mentioned above, I/O controller 740 can interact with audio subsystem 720 or display subsystem 730 or both. For example, input through a microphone or other audio device can provide input or commands for one or more applications or functions of system 700. Additionally, audio output can be provided instead of or in addition to display output. In another example, if display subsystem includes a touchscreen, the display device also acts as an input device, which can be at least partially managed by I/O controller 740. There can also be additional buttons or switches on system 700 to provide I/O functions managed by I/O controller 740.

In one example, I/O controller 740 manages devices such as accelerometers, cameras, light sensors or other environmental sensors, gyroscopes, global positioning system (GPS), or other hardware that can be included in system 700, or sensors 712. The input can be part of direct user interaction, as well as providing environmental input to the system to influence its operations (such as filtering for noise, adjusting displays for brightness detection, applying a flash for a camera, or other features).

In one example, system 700 includes power management 750 that manages battery power usage, charging of the battery, and features related to power saving operation. Power management 750 manages power from power source 752, which provides power to the components of system 700. In one example, power source 752 includes an AC to DC (alternating current to direct current) adapter to plug into a wall outlet. Such AC power can be renewable energy (e.g., solar power, motion based power). In one example, power source 752 includes only DC power, which can be provided by a DC power source, such as an external AC to DC converter. In one example, power source 752 includes wireless charging hardware to charge via proximity to a charging field. In one example, power source 752 can include an internal battery or fuel cell source.

Memory subsystem 760 includes memory device(s) 762 for storing information in system 700. Memory subsystem 760 can include nonvolatile (state does not change if power to the memory device is interrupted) or volatile (state is indeterminate if power to the memory device is interrupted)

memory devices, or a combination. Memory 760 can store application data, user data, music, photos, documents, or other data, as well as system data (whether long-term or temporary) related to the execution of the applications and functions of system 700. In one example, memory subsystem 760 includes memory controller 764 (which could also be considered part of the control of system 700, and could potentially be considered part of processor 710). Memory controller 764 includes a scheduler to generate and issue commands to control access to memory device 762.

Connectivity 770 includes hardware devices (e.g., wireless or wired connectors and communication hardware, or a combination of wired and wireless hardware) and software components (e.g., drivers, protocol stacks) to enable system 700 to communicate with external devices. The external device could be separate devices, such as other computing devices, wireless access points or base stations, as well as peripherals such as headsets, printers, or other devices. In one example, system 700 exchanges data with an external device for storage in memory or for display on a display device. The exchanged data can include data to be stored in memory, or data already stored in memory, to read, write, or edit data.

Connectivity 770 can include multiple different types of connectivity. To generalize, system 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), 5G, or other cellular service standards. Wireless connectivity 774 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 780 include hardware interfaces and connectors, as well as software components (e.g., drivers, protocol stacks) to make peripheral connections. It will be understood that system 700 could both be a peripheral device ("to" 782) to other computing devices, as well as have peripheral devices ("from" 784) connected to it. System 700 commonly has a "docking" connector to connect to other computing devices for purposes such as managing (e.g., downloading, uploading, changing, synchronizing) content on system 700. Additionally, a docking connector can allow system 700 to connect to certain peripherals that allow system 700 to control content output, for example, to audiovisual or other systems.

In addition to a proprietary docking connector or other proprietary connection hardware, system 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example a nonvolatile memory device includes: multiple nonvolatile (NV) memory arrays to collectively store a block of data, each array to store a portion of the block of data, and one of the NV memory arrays to store a write count for the block of data; and a command bus interface to receive a write command to write the block of data to the NV memory arrays, wherein in response to receipt of the write command, the NV memory arrays are to perform an internal pre-write read of the data in the NV memory arrays, wherein the one NV memory array is to perform a pre-write read of the write count, increment the write count internal to the one NV memory array, and write the incremented write count to the one NV memory array.

In one example, the NV memory arrays comprise separate NV memory chips. In one example, the one NV memory array is further to store error checking and correction (ECC) data. In one example, the NV memory arrays further comprise registers to store a write count configuration, and where the one NV memory array is to store a register configuration for a write count mode, and the other NV memory arrays are to store a register configuration to not enable the write count mode. In one example, the NV memory arrays further comprise auto-increment hardware, wherein the write count mode is to selectively enable or disable the auto-increment hardware. In one example, the NV memory arrays are to perform the pre-write read of the data in the NV memory arrays, compare the data in the NV memory arrays with data to be written, and only write bits having a different value due to the write command. In one example, the one NV memory array is to store a write threshold, and pass an alert to an associated controller in response to the write count reaching the write threshold.

In general with respect to the descriptions herein, in one example a system includes: a controller; and a nonvolatile memory device including multiple nonvolatile (NV) memory arrays to collectively store a block of data, each array to store a portion of the block of data, and one of the NV memory arrays to store a write count for the block of data; and a command bus interface to receive a write command to write the block of data to the NV memory arrays, wherein in response to receipt of the write command, the NV memory arrays are to perform an internal pre-write read of the data in the NV memory arrays, wherein the one NV memory array is to perform a pre-write read of the write count, increment the write count internal to the one NV memory array, and write the incremented write count to the one NV memory array.

In one example, the NV memory arrays comprise separate NV memory chips. In one example, the one NV memory array is further to store error checking and correction (ECC) data. In one example, the NV memory arrays further comprise registers to store a write count configuration, and where the one NV memory array is to store a register configuration for a write count mode, and the other NV memory arrays are to store a register configuration to not enable the write count mode. In one example, the NV memory arrays further comprise auto-increment hardware, wherein the write count mode is to selectively enable or disable the auto-increment hardware. In one example, the one NV memory array is to store a write threshold, and pass an alert to the controller in response to the write count reaching the write threshold. In one example, the system further includes one or more of: a host processor device coupled to the nonvolatile memory device; a display communicatively coupled to a host processor; a network interface communicatively coupled to a host processor; or a battery to power the system.

In general with respect to the descriptions herein, in one example a method includes: storing a block of data collectively in multiple nonvolatile (NV) memory arrays, each array storing a portion of the block of data, and one of the NV memory arrays storing a write count for the block of data; and receiving a write command to write the block of data to the NV memory arrays, wherein in response to receiving the write command, the NV memory arrays are to perform an internal pre-write read of the data in the NV memory arrays, wherein the one NV memory array is to perform a pre-write read of the write count, increment the write count internal to the one NV memory array, and write the incremented write count to the one NV memory array.

In one example, the NV memory arrays comprise separate NV memory chips. In one example, the one NV memory array further storing error checking and correction (ECC) data. In one example, the NV memory arrays further comprise registers storing a write count configuration, and where the one NV memory array stores a register configuration for a write count mode, and the other NV memory arrays store a register configuration to not enable the write count mode. In one example, the NV memory arrays further comprise auto-increment hardware, wherein the write count mode selectively enables or disables the auto-increment hardware. In one example, the one NV memory array further storing a write threshold, wherein the one NV memory array is to pass an alert to an associated controller in response to the write count reaching the write threshold.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. A nonvolatile memory device comprising:
    multiple nonvolatile (NV) memory arrays connected in parallel to collectively store a block of data, each array configured to store a portion of the block of data, and one of the NV memory arrays configured to store a write count for the block of data; and
    a command bus interface configured to receive a write command to write the block of data to the NV memory arrays, wherein in response to receipt of the write command, the NV memory arrays are to perform an internal pre-write read of the block of data in the NV memory arrays, wherein the one NV memory array is to perform a pre-write read of the write count, increment the write count internal to the one NV memory array, and write the incremented write count to the one NV memory array.

2. The nonvolatile memory device of claim 1, wherein the NV memory arrays comprise separate NV memory chips.

3. The nonvolatile memory device of claim 1, wherein the one NV memory array is further to store error checking and correction (ECC) data.

4. The nonvolatile memory device of claim 1, wherein the NV memory arrays further comprise registers to store a write count configuration, and where the one NV memory array is to store a register configuration for a write count mode, and the other NV memory arrays are to store a register configuration to not enable the write count mode.

5. The nonvolatile memory device of claim 4, wherein the NV memory arrays further comprise auto-increment hardware, wherein the write count mode is to selectively enable or disable the auto-increment hardware.

6. The nonvolatile memory device of claim 1, wherein the NV memory arrays are to perform the pre-write read of the block of data in the NV memory arrays, compare data in the NV memory arrays with data to be written, and only write bits having a different value due to the write command.

7. The nonvolatile memory device of claim 1, wherein the one NV memory array is to store a write threshold, and pass an alert to an associated controller in response to the write count reaching the write threshold.

8. A system, comprising:
    a controller; and
    a nonvolatile memory device including
        multiple nonvolatile (NV) memory arrays connected in parallel to collectively store a block of data, each array configured to store a portion of the block of data, and one of the NV memory arrays configured to store a write count for the block of data; and
        a command bus interface configured to receive a write command to write the block of data to the NV memory arrays, wherein in response to receipt of the write command, the NV memory arrays are to perform an internal pre-write read of the block of data in the NV memory arrays, wherein the one NV memory array is to perform a pre-write read of the write count, increment the write count internal to the one NV memory array, and write the incremented write count to the one NV memory array.

9. The system of claim 8, wherein the NV memory arrays comprise separate NV memory chips.

10. The system of claim 8, wherein the one NV memory array is further to store error checking and correction (ECC) data.

11. The system of claim 8, wherein the NV memory arrays further comprise registers to store a write count configuration, and where the one NV memory array is to store a register configuration for a write count mode, and the other NV memory arrays are to store a register configuration to not enable the write count mode.

12. The system of claim 11, wherein the NV memory arrays further comprise auto-increment hardware, wherein the write count mode is to selectively enable or disable the auto-increment hardware.

13. The system of claim 8, wherein the one NV memory array is to store a write threshold, and pass an alert to the controller in response to the write count reaching the write threshold.

14. The system of claim 8, further comprising one or more of:
- a host processor device coupled to the nonvolatile memory device;
- a display communicatively coupled to a host processor;
- a network interface communicatively coupled to a host processor; or
- a battery to power the system.

15. A method comprising:
storing a block of data collectively in multiple nonvolatile (NV) memory arrays connected in parallel, each array storing a portion of the block of data, and one of the NV memory arrays storing a write count for the block of data; and
receiving a write command to write the block of data to the NV memory arrays, wherein in response to receiving the write command, the NV memory arrays are to perform an internal pre-write read of the block of data in the NV memory arrays, wherein the one NV memory array is to perform a pre-write read of the write count, increment the write count internal to the one NV memory array, and write the incremented write count to the one NV memory array.

16. The method of claim 15, wherein the NV memory arrays comprise separate NV memory chips.

17. The method of claim 15, wherein the one NV memory array further storing error checking and correction (ECC) data.

18. The method of claim 15, wherein the NV memory arrays further comprise registers storing a write count configuration, and where the one NV memory array stores a register configuration for a write count mode, and the other NV memory arrays store a register configuration to not enable the write count mode.

19. The method of claim 18, wherein the NV memory arrays further comprise auto-increment hardware, wherein the write count mode selectively enables or disables the auto-increment hardware.

20. The method of claim 15, wherein the one NV memory array further storing a write threshold, wherein the one NV memory array is to pass an alert to an associated controller in response to the write count reaching the write threshold.

* * * * *